(12) United States Patent
Bezel et al.

(10) Patent No.: US 9,232,622 B2
(45) Date of Patent: *Jan. 5, 2016

(54) GAS REFRACTION COMPENSATION FOR LASER-SUSTAINED PLASMA BULBS

(71) Applicant: KLA-Tencor Corporation, Milpitas, CA (US)

(72) Inventors: Ilya Bezel, Sunnyvale, CA (US); Anatoly Shchemelinin, Pleasanton, CA (US); Alex Salnik, San Jose, CA (US); Anant Chimmalgi, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/476,149

(22) Filed: Sep. 3, 2014

(65) Prior Publication Data

US 2014/0367592 A1 Dec. 18, 2014

Related U.S. Application Data

(63) Continuation-in-part of application No. 14/183,134, filed on Feb. 18, 2014, now Pat. No. 8,853,655.

(60) Provisional application No. 61/767,917, filed on Feb. 22, 2013.

(51) Int. Cl.
| | |
|---|---|
| *F21V 5/00* | (2015.01) |
| *F21V 7/00* | (2006.01) |
| *F21V 13/00* | (2006.01) |
| *F21V 13/04* | (2006.01) |

(Continued)

(52) U.S. Cl.
CPC ............ *H05G 2/008* (2013.01); *G03F 7/70016* (2013.01); *H01J 61/02* (2013.01); *H01J 61/025* (2013.01); *H01J 61/04* (2013.01); *H01J 61/302* (2013.01); *H01J 61/33* (2013.01)

(58) Field of Classification Search
USPC ............ 250/493.1, 503.1, 504 R, 526, 432 R; 313/110–114, 567, 568, 231.31, 313/231.41, 231.61, 231.71, 358; 315/111.21, 111.71, 111.91; 362/276, 362/609, 623, 632, 553, 560, 562, 84, 259, 362/326–329, 362, 375
See application file for complete search history.

(56) References Cited

U.S. PATENT DOCUMENTS 3,943,324 A * 3/1976 Haggerty .................. 219/121.63
4,197,157 A * 4/1980 Haggerty ........................ 117/18

(Continued)

FOREIGN PATENT DOCUMENTS

| EP | 0550677 | 7/1993 |
| EP | 0886796 | 12/1998 |

(Continued)

*Primary Examiner* — Bernard E Souw
(74) *Attorney, Agent, or Firm* — Meyertons, Hood, Kivlin, Kowert & Goetzel, P.C.; Eric B. Meyertons

(57) ABSTRACT

A laser-sustained plasma illuminator system includes at least one laser light source to provide light. At least one reflector focuses the light from the laser light source at a focal point of the reflector. An enclosure substantially filled with a gas is positioned at or near the focal point of the reflector. The light from the laser light source at least partially sustains a plasma contained in the enclosure. The enclosure has at least one wall with at least one property that is varied to compensate for optical aberrations in the system.

18 Claims, 3 Drawing Sheets

(51) Int. Cl.

| | |
|---|---|
| *H01J 61/02* | (2006.01) |
| *H05G 2/00* | (2006.01) |
| *G03F 7/20* | (2006.01) |
| *H01J 61/30* | (2006.01) |
| *H01J 61/33* | (2006.01) |
| *H01J 61/04* | (2006.01) |

(56) References Cited

U.S. PATENT DOCUMENTS

| | | | |
|---|---|---|---|
| 6,046,858 A | 4/2000 | Scott et al. | |
| 7,705,331 B1 * | 4/2010 | Kirk et al. | 250/493.1 |
| 8,182,127 B2 | 5/2012 | Yasuda et al. | |
| 8,203,696 B2 | 6/2012 | Bittner et al. | |
| 8,242,695 B2 | 8/2012 | Sumitomo et al. | |
| 8,525,138 B2 * | 9/2013 | Smith et al. | 250/503.1 |
| 8,658,967 B2 * | 2/2014 | Bezel et al. | 250/251 |
| 8,853,655 B2 * | 10/2014 | Bezel et al. | 250/493.1 |
| 2007/0228288 A1 | 10/2007 | Smith | |
| 2007/0228300 A1 * | 10/2007 | Smith | 250/504 R |
| 2009/0213389 A1 | 8/2009 | Ouchi et al. | |
| 2011/0181191 A1 | 7/2011 | Smith et al. | |
| 2012/0026477 A1 | 2/2012 | Rooijakkers | |
| 2012/0068091 A1 | 3/2012 | Endo et al. | |
| 2013/0003384 A1 * | 1/2013 | Bezel et al. | 362/276 |
| 2013/0106275 A1 * | 5/2013 | Chimmalgi et al. | 313/39 |
| 2013/0181595 A1 | 7/2013 | Bezel et al. | 313/112 |
| 2013/0342105 A1 * | 12/2013 | Shchemelinin et al. | 315/111.21 |
| 2014/0042336 A1 * | 2/2014 | Bezel et al. | 250/424 |

FOREIGN PATENT DOCUMENTS

| | | |
|---|---|---|
| EP | 2115371 | 11/2009 |
| EP | 2326139 | 5/2011 |

* cited by examiner

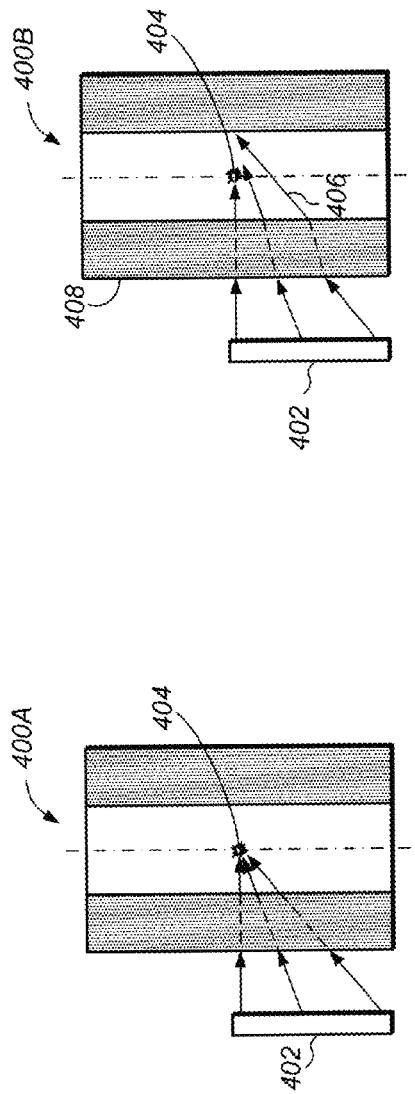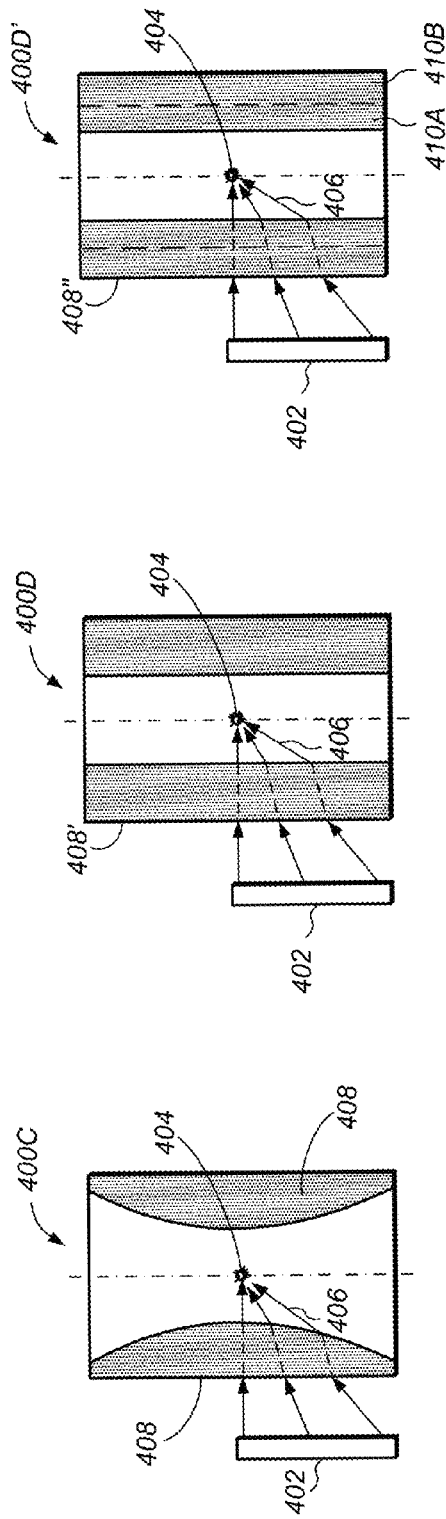

GAS REFRACTION COMPENSATION FOR LASER-SUSTAINED PLASMA BULBS

PRIORITY CLAIM

This patent is a continuation-in-part of U.S. patent application Ser. No. 14/183,134 entitled "GAS REFRACTION COMPENSATION FOR LASER-SUSTAINED PLASMA BULBS" filed Feb. 18, 2014, which claims priority to U.S. Provisional Patent Application No. 61/767,917 filed Feb. 22, 2013, which are incorporated herein by reference.

BACKGROUND

1. Field of the Invention

The present invention relates to laser-sustained plasma illuminator systems. More particularly, the invention relates to systems and methods for compensating for optical aberrations to optimize plasma performance and UV light collection.

2. Description of Related Art

Plasmas sustained by lasers have shapes defined by the laser light intensity distribution near the laser focus. The laser light intensity distribution may be a function of optical aberrations (e.g., how well the light is focused in the plasma cell). Many optical aberrations present in typical laser-sustained plasma illuminator systems are aberrations introduced by an enclosure (e.g., a bulb) used to contain the gas and the plasma. Such bulb-introduced aberrations may be significant optical aberrations, especially for plasmas sustained by lasers operating in the near IR range (wavelengths of about 1000 nm). These significant optical aberrations may result in large size plasmas, the inability to control the bulb envelope, and/or irreproducible plasma shapes.

FIG. 1 depicts different plasma shapes resulting from various optical abberations of a pump beam in different bulbs. Shape 100 results from a pump beam with significant aberrations. These significant aberrations produce a conventional shaped plasma for shape 100. Shape 102 results from a pump beam with less aberrations. These fewer aberrations may produce a spherical shaped plasma for shape 102. Shape 104 results from a pump beam with the fewest aberrations. Shape 104 may be the smallest and brightest plasma shape of the three shapes depicted in FIG. 1 because of the fewest aberrations (e.g., shape 104 may be a "compensated" plasma shape or plasma shape that results after compensating for aberrations).

Aberrations may become particularly large when a high NA (numerical aperture) is used for pumping the plasma. Large pump laser NAs are used as light sources in many current laser-sustained plasma illuminator systems. U.S. Pat. No. 7,705,331 to Kirk et al., which is incorporated by reference as if fully set forth herein, describes an example of a high NA system. FIG. 2 depicts an example of a laser-sustained light source with a high NA. Light source 200 may include laser 202, turn mirror 204, cold mirror 206, homogenizer 208, filters 210, ellipse 212, and enclosure 214. Enclosure 214 may be, for example, a bulb. Ignition cable 216 may be coupled to enclosure 214. Plasma 217 may be generated inside enclosure 214 at or near a focal point of ellipse 212. As shown in FIG. 2, light from laser 202 (e.g., light 218) may be reflected off ellipse 212 and focused in the middle of enclosure 214 at plasma 217. Broad-band UV light (e.g., light 220) from homogenizer 208 may be reflected by cold mirror 206, reflected off ellipse 212, and focused in the middle of enclosure 214 at plasma 217. Light passing through enclosure 214 may be used to excite and/or sustain plasma 217 inside the enclosure. Plasma 217 inside enclosure 214 may provide light for illumination of a specimen for a process performed on the specimen (e.g., an inspection process performed on the specimen). As shown in FIG. 2, light passing through enclosure 214 may have a high NA.

In addition to the aberrations introduced by the enclosure itself, the refractive index of the gas inside the enclosure is another source of aberrations in the system. Gas related aberrations may be especially significant in high-pressure enclosures. FIG. 3 depicts images taken of a bulb at different pressures of Xe (xenon) in the bulb. As shown in FIG. 3, aberrations seen from the bulb increase with increasing pressure.

U.S. Pub. Pat. Appl. Nos. 2007/0228288 and 2007/0228300 to Smith, each of which is incorporated by reference as if fully set forth herein, disclose one method of compensating for aberrations introduced by the refractive index of the walls of the enclosure by modifying the shape of the reflector (e.g., a reflective ellipse). Modifying the shape of the reflector, however, can only account for aberrations from reproducible enclosure shapes. Modifying reflector shapes for each individual enclosure shape and/or different fill pressures is difficult to impractical to implement for most laser-sustained plasma illuminator systems.

SUMMARY

In certain embodiments, a laser-sustained plasma illuminator system includes at least one laser light source to provide light. At least one reflector focuses the light from the laser light source at a focal point of the reflector. An enclosure substantially filled with a gas is positioned at or near the focal point of the reflector. The light from the laser light source at least partially sustains a plasma contained in the enclosure. The enclosure has at least one wall with at least one property that is varied. The at least one property of the wall may be varied to compensate for optical aberrations in the system. In some embodiments, a thickness of the wall is varied. In some embodiments, a refractive index of the wall is varied.

In certain embodiments, a method for compensating for optical aberrations in a laser-sustained plasma illuminator system includes providing an enclosure for containing a plasma to the laser-sustained plasma illuminator system. The enclosure may have at least one wall with at least one property that is varied to compensate for optical aberrations in the system.

In certain embodiments, a laser-sustained plasma illuminator system includes at least one laser light source to provide light. At least one reflector focuses the light from the laser light source at a focal point of the reflector. An enclosure may include two or more different materials and be substantially filled with a gas positioned at or near the focal point of the reflector. The light from the at least one laser light source at least partially sustains a plasma contained in the enclosure. The enclosure has at least one wall formed from the two or more different materials with at least one property of the wall being varied.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIG. 4A depicts an embodiment of an ideal enclosure with no compensation needed.

FIG. 4B depicts an embodiment of an enclosure with shape induced aberrations and no compensation.

FIG. 4C depicts an embodiment of an enclosure with walls having varying thickness to compensate for enclosure shape aberrations.

FIG. 4D depicts an embodiment of an enclosure with walls having varying refractive index to compensate for enclosure shape aberrations.

FIG. 4E depicts an embodiment of an enclosure made of two different materials.

Figure 1:
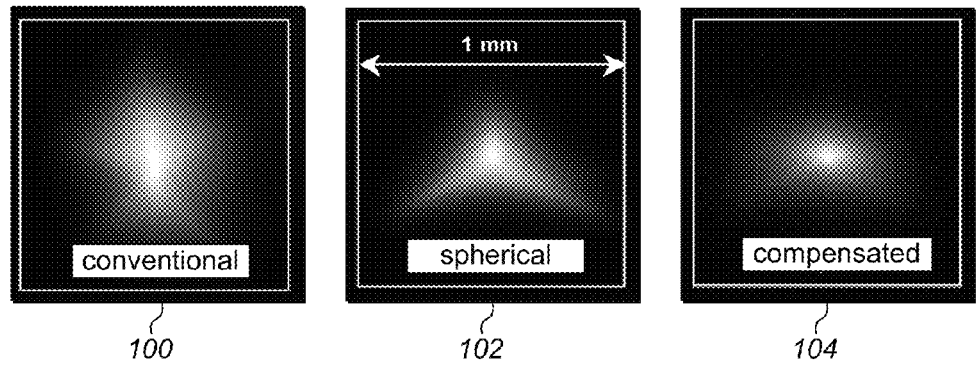
FIG. 1 depicts different plasma shapes resulting from various optical abberations of a pump beam in different bulbs.
Figure 2:
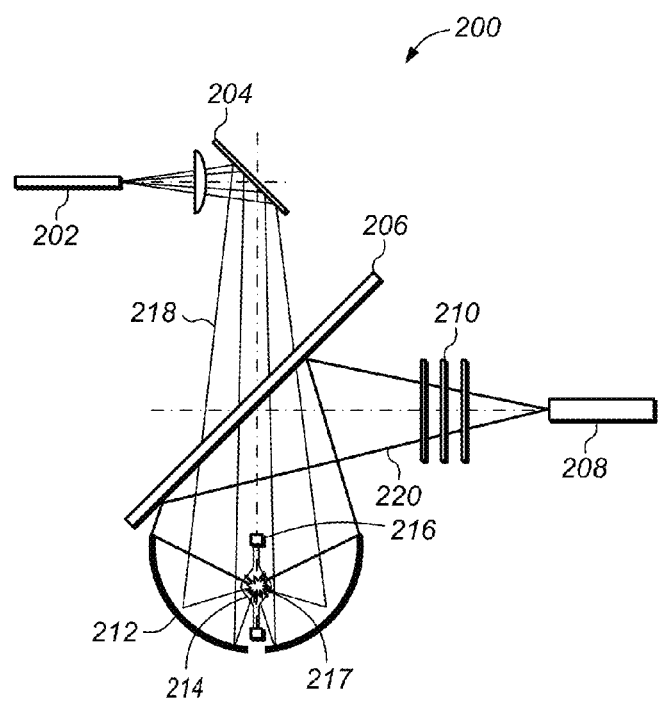
FIG. 2 depicts an example of a laser-sustained light source with a high numerical aperture (NA).
Figure 3:
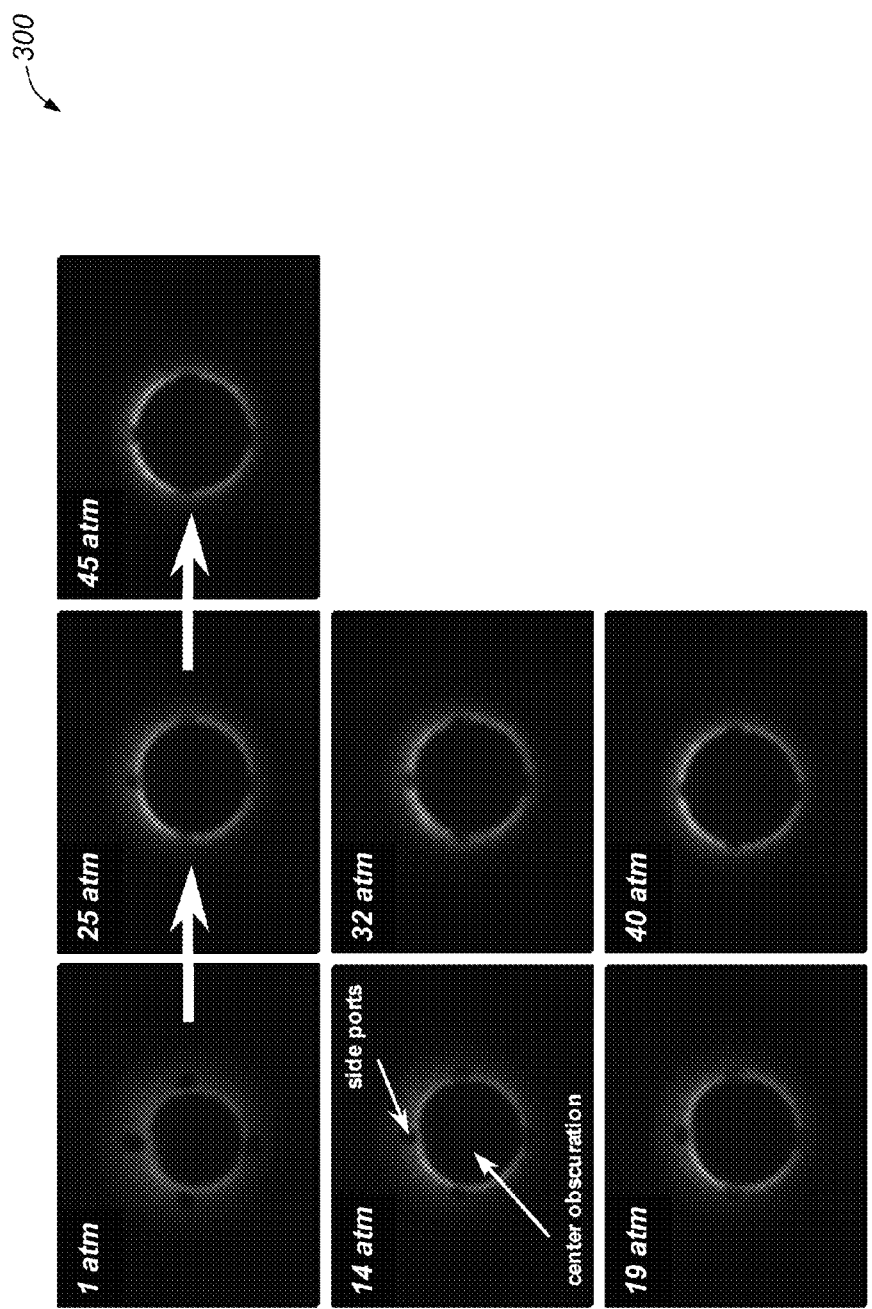
FIG. 3 depicts images taken of a bulb at different pressures of Xe (xenon) in the bulb.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

One or more properties of a wall of an enclosure (e.g., a bulb) may be varied (e.g. adjusted) to compensate for optical aberrations such as shape aberrations in the enclosure and/or aberrations induced by the gas refractive index (e.g., fill pressure aberrations). In certain embodiments, the wall thickness of the enclosure is adjusted to compensate for optical aberrations. FIG. 4A depicts an embodiment of an ideal enclosure with no compensation needed. Enclosure 400A has no aberrations in shape and no gas induced aberrations. Thus, all light from pump laser 402 is focused at plasma 404. FIG. 4B depicts an embodiment of an enclosure with shape induced aberrations and no compensation. Enclosure 400B has shape aberrations that, without compensation, cause some light from pump laser 402 to not be focused at plasma 404 (e.g., light 406).

FIG. 4C depicts an embodiment of an enclosure with walls having varying thickness to compensate for enclosure shape aberrations. Enclosure 400C has walls 408 with varying thickness. The varying thickness of walls 408 compensates for any enclosure shape aberrations and/or fill pressure aberrations to focus light from pump laser 402 at plasma 404. For example, as shown in FIG. 4C, light 406 is now focused at plasma 404.

In certain embodiments, enclosure 400C is a bulb. The bulb may be, for example, a lamp made of glass (fused silica) using a bulb-specific manufacturing process. In some embodiments, enclosure 400C is any other type of enclosure, vessel, or container that encloses/contains gas and has walls made of a transparent material. Enclosure 400C may be an enclosure made of glass, quartz, sapphire, $CaF_2$, $MgF_2$, or similar materials with proper sealing to enclose/contain a gas. For example, enclosure 400C may be a tube or cell made of glass with sealing to enclose a gas.

In certain embodiments, the thickness variation in walls 408 (e.g., the shape of the walls as defined by changes in the wall thickness along a section of the wall) is defined based on the shape of the envelope of enclosure 400C and/or the gas fill pressure of the enclosure. Varying the thickness of the walls of enclosures (e.g., walls 408 of enclosure 400C) to compensate for aberrations in the enclosures (e.g., enclosure wall thickness compensation) allows a single uncompensated reflector to be used for all types of enclosures with varying shapes and/or fill pressures. Thus, a laser-sustained plasma illuminator system using enclosures with enclosure wall thickness compensation may have improved performance and/or improved cost efficiency compared to typical current laser-sustained plasma illuminator systems (e.g., systems using modified reflector shapes for aberration compensation).

In some embodiments, enclosure wall thickness compensation is used to compensate for aberrations in the collected light path (e.g., the path of light before the light enters the enclosure or the path of light from the light source (laser) through focusing optics (such as mirrors and/or reflectors). In some embodiments, enclosure wall thickness compensation is used to introduce a controlled amount of aberration into a laser-sustained plasma illuminator system. For example, wall thickness may be varied to provide a controlled amount of aberration to optimize plasma performance in the laser-sustained plasma illuminator system.

In some embodiments, enclosure wall thickness compensation is used in combination with other compensation methods. Combining enclosure wall thickness compensation with other compensation methods may provide higher levels of control of aberrations in a laser-sustained plasma illuminator system. For example, in one embodiment, enclosure wall thickness may be varied in combination with the shape of the enclosure. In some embodiments, enclosure wall thickness compensation is combined with compensation using modified reflector shapes to provide greater control of the shape of the plasma.

In certain embodiments, the refractive index of the enclosure is adjusted to compensate for optical aberrations. FIG. 4D depicts an embodiment of an enclosure with walls having varying refractive index to compensate for enclosure shape aberrations. Enclosure 400D may be a bulb or any other type of enclosure, vessel, or container that encloses/contains gas and has walls made of a transparent material as described above. Enclosure 400D may be an enclosure made of glass, quartz, sapphire, $CaF_2$, $MgF_2$, or similar materials with proper sealing to enclose/contain a gas.

In certain embodiments, enclosure 400D includes walls 408' with varying refractive index. Varying the refractive index of walls 408' compensates for any enclosure shape aberrations and/or fill pressure aberrations to focus light from pump laser 402 at plasma 404. For example, as shown in FIG. 4D, light 406 is focused at plasma 404.

In some embodiments, the refractive index of walls 408' of enclosure 400D is varied by varying (e.g. altering) the chemical content of materials used in the walls. For example, one or more materials used in walls 408' may be doped to alter the chemical content (or composition) of the walls. The dopant(s) concentration in walls 408' may be varied to provide a tailored or controlled refractive index profile in the walls. For example, the dopant concentration may provide one or more abrupt transitions (changes) in refractive index in walls 408' or the dopant concentration may provide a gradual change in refractive index in the walls. In some embodiments, the refractive index of walls 408' of enclosure 400D is varied by varying (e.g. altering) a structure (e.g., physical and/or chemical structure) of the walls. For example, the structure of walls 408' may be changed (altered) to be more or less porous to vary the refractive index of the walls.

In some embodiments, the refractive index of walls 408' of enclosure 400D is varied by varying a temperature along the walls. For example, differences in temperature along walls 408' may provide different refractive indices along the walls depending on the material used for the walls. In some embodiments, walls 408' have selected (e.g., patterned) absorption along the walls to vary the temperature along the walls. In some embodiments, walls 408' have selected (e.g., patterned) cooling flow along the walls to vary the temperature along the walls.

In certain embodiments, an enclosure (such as enclosure 400C or enclosure 400D described above) is formed by combining two or more different materials. The combination of two or more different materials may be used to form an enclosure with varying wall thickness (e.g., enclosure 400C) or an enclosure with varying refractive index (e.g., enclosure 400D). For example, the refractive index of walls 408' of enclosure 400D may be varied by combining two or more different refractive index materials to form the walls of the enclosure.

FIG. 4E depicts an embodiment of enclosure 400D' made of two different materials. Enclosure 400D' includes walls 408". Walls 408" may include two different materials 410A, 410B. In certain embodiments, material 410A has a different refractive index from material 410B. The different refractive indices of materials 410A, 410B may provide a varying refractive index in walls 408" of enclosure 400D'. In certain embodiments, enclosure 400D' is formed by coupling, connecting, or attaching together two or more enclosures made of the different materials (e.g., materials 410A, 410B) to form the enclosure. For example, a first enclosure may include material 410A and a second enclosure may include material 410B and enclosure 400D' is formed by coupling together the first enclosure and the second enclosure. In some embodiments, the enclosures of the different materials are concentric enclosures such as concentric cylindrical enclosures.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a wall" includes a combination of two or more walls and reference to "a gas" includes mixtures of gases.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A laser-sustained plasma illuminator system, comprising:
   at least one laser light source configured to provide light;
   at least one reflector configured to focus the light from the at least one laser light source at a focal point of the reflector; and
   an enclosure substantially filled with a gas positioned at or near the focal point of the reflector, wherein the light from the at least one laser light source at least partially sustains a plasma contained in the enclosure, and wherein the enclosure has at least one wall with at least one property that is varied.

2. The system of claim 1, wherein the at least one property of the wall comprises a refractive index of the wall.

3. The system of claim 2, wherein the refractive index of the wall is varied using a varied doping concentration in the wall.

4. The system of claim 2, wherein the refractive index of the wall is varied by varying a temperature along the wall.

5. The system of claim 2, wherein the enclosure comprises two or more enclosures coupled together, and wherein at least two of the two or more enclosures comprise different refractive index materials.

6. The system of claim 1, wherein the at least one property of the wall is varied to compensate for optical aberrations in the system.

7. The system of claim 1, wherein the at least one property of the wall is varied to introduce controlled aberrations into the system.

8. The system of claim 1, wherein the system is configured to illuminate a specimen with light generated by the plasma contained in the enclosure.

9. A method for compensating for optical aberrations in a laser-sustained plasma illuminator system, comprising: providing an enclosure for containing a plasma to the laser-sustained plasma illuminator system, wherein the enclosure has at least one wall with a property that is varied to compensate for optical aberrations in the system.

10. The method of claim 9, wherein the at least one property of the wall comprises a refractive index of the wall.

11. The method of claim 9, wherein the at least one property of the wall is varied to compensate for optical aberrations in the system.

12. The method of claim 9, wherein the at least one property of the wall is varied to introduce controlled aberrations into the system.

13. The method of claim 9, further comprising illuminating a specimen with light generated by the plasma contained in the enclosure.

14. A laser-sustained plasma illuminator system, comprising:
    at least one laser light source configured to provide light;
    at least one reflector configured to focus the light from the at least one laser light source at a focal point of the reflector; and
    an enclosure comprising two or more different materials, wherein the enclosure is substantially filled with a gas positioned at or near the focal point of the reflector, wherein the light from the at least one laser light source at least partially sustains a plasma contained in the enclosure, and wherein the enclosure has at least one wall formed from the two or more different materials with at least one property of the wall being varied.

15. The system of claim 14, wherein the enclosure comprises two or more concentric enclosures coupled together, wherein at least two of the concentric enclosures comprise at least two of the different materials.

16. The system of claim 14, wherein at least one of the different materials comprises a thickness that varies such that the at least one varied property of the wall comprises a thickness of the wall.

17. The system of claim 14, wherein at least two of the different materials comprise different refractive indices such that the at least one varied property of the wall comprises a refractive index of the wall.

18. The system of claim 14, wherein the system is configured to illuminate a specimen with light generated by the plasma contained in the enclosure.

* * * * *